(12) United States Patent
Wang et al.

(10) Patent No.: US 7,701,298 B2
(45) Date of Patent: Apr. 20, 2010

(54) FREQUENCY LOCKING STRUCTURE APPLIED TO PHASE-LOCKED LOOPS

(75) Inventors: Jyh-Hwang Wang, Hsinchu (TW); Wang-Tiao Huang, Hsinchu (TW)

(73) Assignee: Megawin Technology Co., Ltd., Hsinchu (TW)

( * ) Notice: Subject to any disclaimer, the term of this patent is extended or adjusted under 35 U.S.C. 154(b) by 49 days.

(21) Appl. No.: 12/194,233

(22) Filed: Aug. 19, 2008

(65) Prior Publication Data

US 2010/0045391 A1    Feb. 25, 2010

(51) Int. Cl.
*H03L 7/18* (2006.01)
(52) U.S. Cl. .......................................... 331/16; 331/18
(58) Field of Classification Search ............. 331/16–18, 331/25
See application file for complete search history.

(56) References Cited

U.S. PATENT DOCUMENTS 5,694,089 A * 12/1997 Adachi et al. ................. 331/16

* cited by examiner

*Primary Examiner*—David Mis
(74) *Attorney, Agent, or Firm*—Rosenberg, Klein & Lee

(57) ABSTRACT

A frequency locking structure applied to phase-locked loops (PLL) utilizes a common factor to reduce the difference between an output signal of oscillation and an input signal of reference for the jitter reduction of the input signal of reference. Moreover, a count value of clock signal is an input of a greatest-common-factor calculator to acquire an adaptive value and a feedback adaptive value for the common factor of a divider. Such a frequency locking structure both prevents the PLL from being in error about outputting frequency and dynamically adjusts the common factors for different purposes.

13 Claims, 3 Drawing Sheets

FREQUENCY LOCKING STRUCTURE APPLIED TO PHASE-LOCKED LOOPS

BACKGROUND OF THE INVENTION

1. Field of the Invention

The present invention relates to a frequency locking structure, and more particularly to a frequency locking structure applied to phase-locked loops.

2. Background of the Related Art

Phase-locked loops (PLL) are generally used in the recovery of data and clock, modulation and demodulation of frequency and phase, and generation of stable and multiple clock. For the design of signal-mixing integrated circuits and system-on-chip (SOC), the phase-locked loops are necessary for the variable application requirement. Generally, there are specifications to be tested for the PLLs: lock-in range, lock-in time, and jitter.

The PLLs are capable of generating clean and stable clocks. However, the stability of the clocks may be deteriorated by noises and estimated by measuring the jitter outputted from the PLLs. FIG. 1 is a block diagram illustrating a conventional PLL. An input signal (f_in) is processed by a divider 12 (M) to output a reference input signal (ref_in). An oscillator output signal (Vco_out) feedbacked by a PLL 10 is processed by a divider 16 (N) to output a feedback signal (Vco_in). The reference input signal (ref_in) and the oscillator output signal (Vco_out) are inputted into the PLL 10 to generate an output signal. The output signal is processed by a divider 14 (P) to output a frequency output signal (f_out). These relationships may be expressed by the following formula (1):

$$f\_out = f\_in * N/(M*P) \quad (1)$$

wherein (N/(M*P)) is simplified to be a simple integer. Generally, the jitter from the PLL is derived from the design of the PLL 10, the reference input signal (ref_in) from the divider 12 and the jitter of the feedback signal (Vco_out) from the divider 16.

Accordingly, f_out is acquired by the formula (2) in condition that (f_in) is 1 KHz and (f_out) is 12 MKHz as follows:

$$f\_out = 12\ MKHz = 1K * N/(M*P)$$

For example, M is 1 and P is 1 in the formula (2) to acquire N=12000. In the case, the reference input signal (ref_in) and the feedback signal (Vco_in) are identical, and f_in/M is 1K. Thus, the reference input signal (ref_in) and the feedback signal (Vco_in) are 1K, respectively. That is, (f_out) is 12 MKHZ in conditions of ref_in =Vco_in =1K, M=P=1, and N=12000. The clock input of each (f_in) should generate the 1200 frequency output of (Lout). (Vco_in) and (ref_in) are identical in condition that N should be 12000. However, when the signal jitter of (f_in) is very high and the difference between (ref_in) and (Vco_out) is large, the clock jitter of (Vco_out) correspondingly increases.

SUMMARY OF THE INVENTION

The present invention is directed to a frequency locking structure applied to phase locked loops to reduce the difference between a reference input signal and an oscillator output signal for improving the jitter of the reference input signal and reducing the clock jitter of the oscillator output signal.

The present invention is directed to a frequency locking structure applied to phase locked loops using a common factor as a reduction ratio for the reduction of difference between the reference input signal (ref_in) and the oscillator output signal (Vco_out). The jitter of the reference input signal is improved and the clock jitter of the oscillator output signal is reduced to prevent erroneous input reference.

The present invention is directed to a frequency locking structure applied to phase locked loops to compare a clock signal and an input signal for the dynamic calculation of a common factor available in various condition.

Furthermore, the present invention is directed to a frequency locking structure applied to phase locked loops to provide a circuit with the frequency locking structure having enhanced signal-to-noise ratio (SNR).

Accordingly, the present invention provides a frequency locking structure applied to phase-locked loops, which includes: a first divider for receiving an input signal and dividing the input signal by a first constant factor; a multiplexer for coupling the first divider receiving a signal from the first divider and multiplying the signal from the first divider together with a common factor to output a reference input signal; a phase-locked loop for coupling the multiplexer, and receiving the reference input signal and a feedback signal to output an oscillator output signal; a second divider coupled the phase-locked loop, receiving the oscillator output signal and dividing the oscillator output signal by a second constant factor to acquire the feedback signal, and transmitting the feedback signal into the phase-locked loop; and a third divider, coupling the phase-locked loop, receiving the oscillator output signal and dividing the oscillator output signal by a third constant factor to output an output signal.

Accordingly, the present invention provides a frequency locking circuit applied to phase-locked loops, which includes: a first divider for receiving an input signal and dividing the input signal by a first constant factor to output a signal; a counter coupled the first divider for receiving the signal from the first divider and a clock signal to output a count; a maximum common factor calculating device, coupled the counter to receive the count and a number generator to receive a number, and calculating a maximum common factor of the count and the number to output a clock adjustment and a feedback adjustment; a second divider, for receiving the clock signal, coupled the maximum common factor calculating device to receive the clock adjustment, and dividing the clock signal by the clock adjustment to acquire a reference input signal; a phase-locked loop coupled the second divider for receiving the reference input signal, receiving a feedback signal to output an oscillator output signal; a fourth divider coupled the phase-locked loop for receiving the oscillator output signal, dividing the oscillator output signal by the feedback adjustment to acquire a feedback signal, and transmitting the feedback signal into the phase-locked loop; and a fifth divider, coupled to the phase-locked loop for receiving the oscillator output signal and dividing the oscillator output signal by a second constant factor to output an output signal.

DETAILED DESCRIPTION OF THE INVENTION

The invention is directed to a frequency locking structure applied to phase-locked loops. The difference between a reference input signal (ref_in) and an oscillator output signal (Vco_out) is reduced by utilizing a common factor to prevent the oscillator output signal (Vco_out) from clock jitter.

Figure 1:
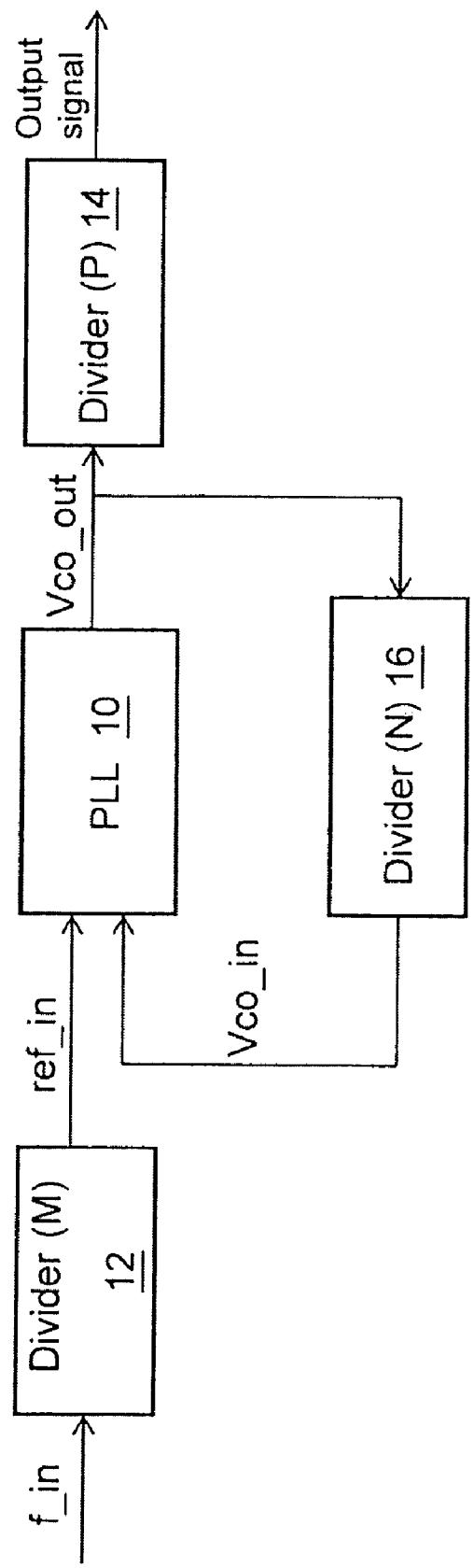
FIG. 1 is a block diagram illustrating a conventional PLL.
Figure 2:
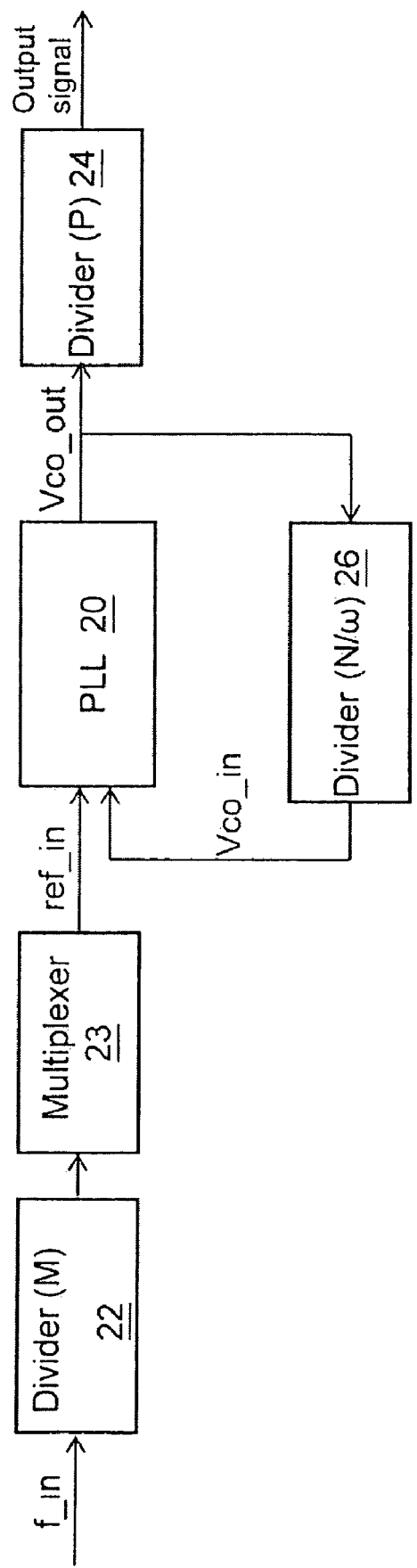
FIG. 2 is a schematic block diagram illustrating an example frequency locking structure in accordance to one embodiment of the invention.

FIG. 2 is a schematic block diagram illustrating an example frequency locking structure in accordance with one embodiment of the invention. A first divider 22 receives an input signal (f_in) and divides the input signal (f_in) by a first constant factor (M). A multiplexer 23 couples the first divider 22 to receive a signal from the first divider 22 and multiplies the signal from the first divider 22 together with a common factor ($\omega$) to output a reference input signal (ref_in). A phase-locked loop 20 couples the multiplexer 23, receives the reference input signal (ref_in) and a feedback signal (Vco_in) to output an oscillator output signal (Vco_out). A second divider 26 couples the phase-locked loop 20, receives the oscillator output signal (Vco_out), divides the oscillator output signal (Vco_out) by a second constant factor (N/$\omega$) to acquire the feedback signal (Vco_in), and transmits the feedback signal (Vco_in) into the phase-locked loop 2. A third divider 24 couples the phase-locked loop 20, receives the oscillator output signal (Vco_out) and divides the oscillator output signal (Vco_out) by a third constant factor (P) to output an output signal (Lout).

In an aspect of the invention, the difference between the oscillator output signal (Vco_out) and the reference input signal (ref_in) and the amount of jitter of the reference input signal (ref_in) may be reduced without changing the oscillator output signal (Vco_out). The reduction of clock jitter may prevent erroneous output frequency. First, the common factor ($\omega$) is used as a reduction ratio and a formula (2) is derived from the formula (1):

$$f\_out = f\_in * N / (M * P) \quad (2)$$
$$= f\_in * N * \omega / (M * P * \omega)$$
$$= (f\_in * \omega) * (N / \omega) * (1 / M * P)$$

The common factor ($\omega$) is led in the formula (2) in the case that f_out, M, P are not changed. Thus, a new input signal f_in'=f_in*$\omega$ and constant factor N'=N/$\omega$ are derived. The reduction of difference between the input signal f_in'=f_in*$\omega$ and the oscillator output signal (Vco_out) can reduce the clock jitter of the oscillator output signal (Vco_out).

Figure 3:
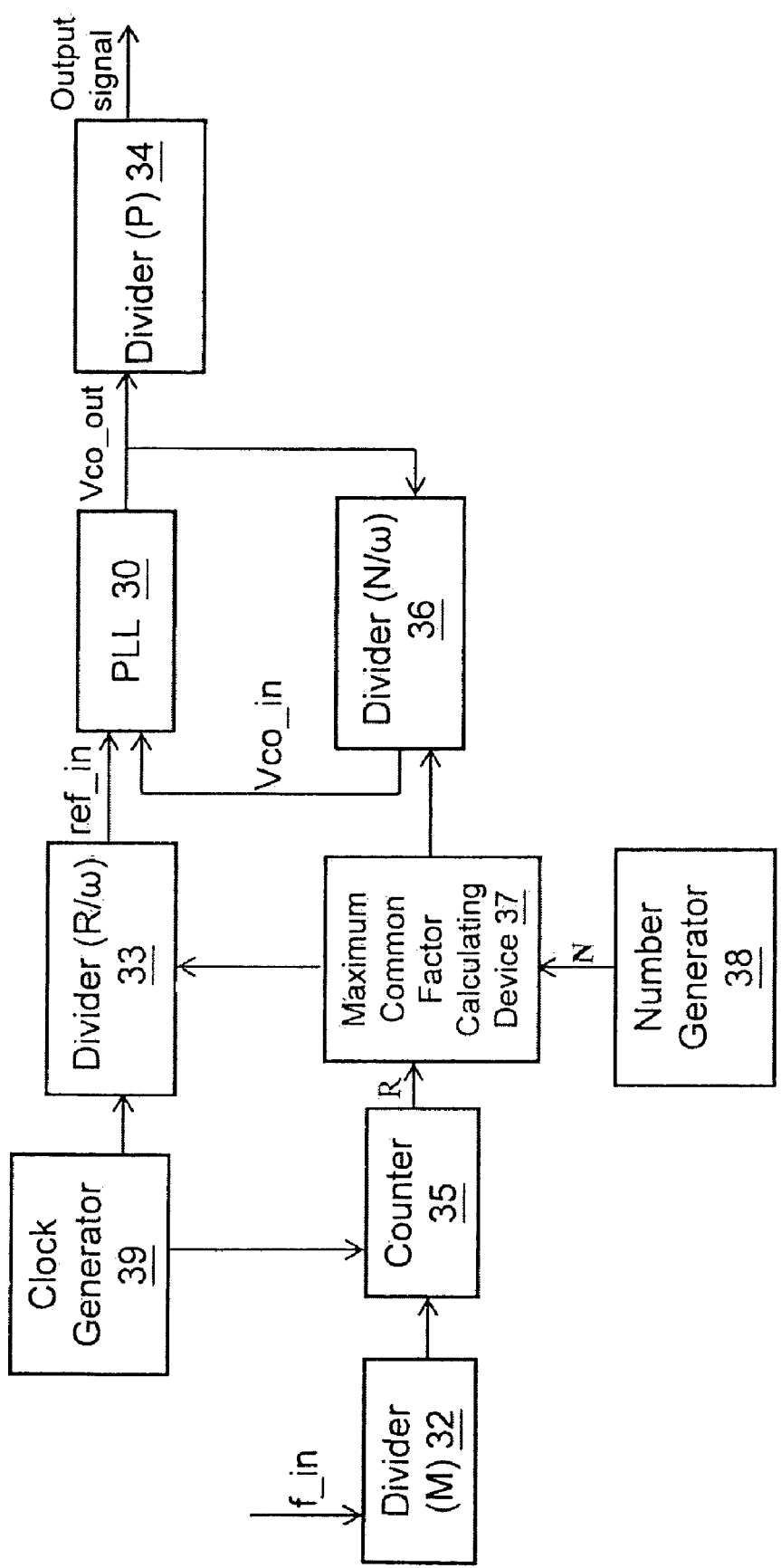
FIG. 3 is a schematic block diagram illustrating an example circuit in accordance with one embodiment of the present invention.

FIG. 3 is a schematic block diagram illustrating an example circuit in accordance with one embodiment of the present invention. A clock generator 39 provides a second divider 33 and a counter 35 with a clock signal (fclk). A first divider 32 receives an input signal (f_in) and divides the input signal (f_in) by the first constant factor (M) to output a signal. The counter 35 is coupled to the first divider 32 and the clock generator 39. The counter 35 receives the signal from the first divider 32 and the clock signal (fclk) to generate a count R. A maximum common factor calculating device 37 is coupled to the counter 35 to receive the count R and a number generator 38 to receive a number N. The maximum common factor calculating device 37 is configured for calculating a maximum common factor $\omega$ of the count R and the number N to output a clock adjustment R/$\omega$ and a feedback adjustment N/$\omega$. The clock adjustment R/$\omega$ and the feedback adjustment N/$\omega$ are respectively inputted into the second divider 33 and a fourth divider 36. The second divider 33 is coupled the clock generator 39 to receive the clock signal (fclk) and divide the clock signal (fclk) by the clock adjustment R/$\omega$ to a reference input signal (ref_in). A phase-locked loop 30 is coupled to the second divider 33 to receive the reference input signal (ref_in) and a feedback signal (Vco_in) to output an oscillator output signal (Vco_out). The fourth divider 36 is coupled to the phase-locked loop 30 to receive the oscillator output signal (Vco_out) and divide the oscillator output signal (Vco_out) by the feedback adjustment N/$\omega$ to acquire the feedback signal (Vco_in). The feedback signal (Vco_in) is inputted into the phase-locked loop 30. A fifth divider 34 is coupled the phase-locked loop 30 to receive the oscillator output signal (Vco_out) and divide the oscillator output signal (Vco_out) by a second constant factor P to output an output signal (f_out).

In view of the formula (2) associated with the aforementioned circuit, N/(M*P) is a simple number and (f_in*$\omega$) is acquired from the clock signal (fclk). The clock signal (fclk) is used to count the input signal (f_in) to acquire the count R, as a result of the clock signal (fclk) of a frequency faster than the input signal (f_in) and a period with jitter smaller than the input signal (f_in). Their relationship may be expressed by the following formula (3):

$$R = \text{Period of } (f\_in) / \text{Period of } (fclk) \quad (3)$$
$$= (1/f\_in)/(1/fclk)$$
$$= fclk/f\_in$$

That is, f_in is equal to (fclk/R).

Furthermore, for the maximum common factor calculating device 37, the count R and the number N are acquired to generate the maximum common factor GCD (R,W)=$\omega$ for the requirement of an (N/$\omega$) of integer. Thus, $\omega$ meets the integer requirement of the ratio of (N/$\omega$) and (R/$\omega$), respectively. Next, (f_in*$\omega$) is acquired by the formula (4):

$$f\_in*\omega=(fclk/R)*\omega=fclk/(R/\omega) \quad (4)$$

The formula (5) may be derived from the formula (2):

$$f\_out=(fclk/(R/\omega))*((N/\omega)/(M*P)) \quad (5)$$

In a practical application, processing of audio signal which is sensitive to the clock jitter is taken as an example. The system is implemented by setting f_in=1 Khz, f_out=12 MHz, M=1, P=1, and N=12000. The results are indicated as follows.

SNR=56.12 dB when $\omega$ is 1.
SNR=60.97 dB when $\omega$ is 2.
SNR=64.80 dB when $\omega$ is 3.
SNR=65.56 dB when $\omega$ is 4.
SNR=67.66 dB when $\omega$ is 8.

Accordingly, the increase of $\omega$ enhances SNR.

The frequency locking structure of the invention applied to a circuit in practice, the optimized value of $\omega$ is dynamically acquired for various systemic conditions with the combination of f_in, f_out or fclk. Thus, the acquisition of $\omega$ is available for the various conditions, for example but not limited to, f_in =2K or 0.5K respectively in combination of f_out=24M and 40 MHz.

Although the present invention has been explained in relation to its preferred embodiment, it is to be understood that other modifications and variation can be made without departing the spirit and scope of the invention as hereafter claimed.

What is claimed is:

1. A frequency locking structure applied to phase-locked loops, comprising:
a first divider, for receiving an input signal and dividing the input signal by a first constant factor;

a multiplexer, coupling the first divider, for receiving a signal from the first divider and multiplying the signal from the first divider together with a common factor to output a reference input signal;

a phase-locked loop, coupling the multiplexer, for receiving the reference input signal and a feedback signal to output an oscillator output signal;

a second divider, coupled the phase-locked loop, for receiving the oscillator output signal and dividing the oscillator output signal by a second constant factor to acquire the feedback signal, and transmitting the feedback signal into the phase-locked loop; and a third divider, coupled to the phase-locked loop, for receiving the oscillator output signal and dividing the oscillator output signal by a third constant factor to output an output signal.

2. The frequency locking structure applied to phase-locked loops according to claim 1, wherein the first constant factor is an integer.

3. The frequency locking structure applied to phase-locked loops according to claim 1, wherein the second constant factor is a fourth constant factor divided by the common factor.

4. The frequency locking structure applied to phase-locked loops according to claim 3, wherein the fourth constant factor is equal to difference between the oscillator output signal and the reference input signal multiplied by the integer.

5. The frequency locking structure applied to phase-locked loops according to claim 1, wherein the common factor is a maximum reduction ratio of the reference input signal and the oscillator output signal.

6. A frequency locking circuit applied to phase-locked loops, comprising:

a first divider, for receiving an input signal and dividing the input signal by a first constant factor to output a signal;

a counter, coupled to the first divider, for receiving the signal from the first divider and a clock signal to output a count;

a maximum common factor calculating device, coupled to the counter to receive the count and a number generator to receive a number, and calculating a maximum common factor of the count and the number to output a clock adjustment and a feedback adjustment;

a second divider, for receiving the clock signal, coupled to the maximum common factor calculating device to receive the clock adjustment, and dividing the clock signal by the clock adjustment to acquire a reference input signal;

a phase-locked loop, coupled to the second divider to receive the reference input signal, for receiving a feedback signal to output an oscillator output signal;

a fourth divider, coupled to the phase-locked loop to receive the oscillator output signal, for dividing the oscillator output signal by the feedback adjustment to acquire a feedback signal, and transmitting the feedback signal into the phase-locked loop; and a fifth divider, coupled to the phase-locked loop to receive the oscillator output signal, for dividing the oscillator output signal by a second constant factor to output an output signal.

7. The frequency locking circuit applied to phase-locked loops according to claim 6, wherein the first constant factor is an integer.

8. The frequency locking circuit applied to phase-locked loops according to claim 6, wherein a frequency of the clock signal is higher than a frequency of the signal from the first divider.

9. The frequency locking circuit applied to phase-locked loops according to claim 6, wherein the count is an integer.

10. The frequency locking circuit applied to phase-locked loops according to claim 6, wherein the number is an integer.

11. The frequency locking circuit applied to phase-locked loops according to claim 6, wherein the clock adjustment is acquired from the count divided by the maximum common factor.

12. The frequency locking circuit applied to phase-locked loops according to claim 6, wherein the feedback adjustment is acquired from the number divided by the maximum common factor.

13. The frequency locking circuit, applied to phase-locked loops according to claim 6, wherein the common factor is, a maximum reduction ratio of the reference input signal and the oscillator output signal.

* * * * *